US012796112B2

(12) United States Patent
Gu et al.

(10) Patent No.: US 12,796,112 B2
(45) Date of Patent: Nov. 10, 2026

(54) METHOD FOR PROCESSING CURVED PHOTOVOLTAIC TILE, AND CURVED PHOTOVOLTAIC TILE

(71) Applicant: SHENZHEN HELLO TECH ENERGY CO., LTD, Shenzhen (CN)

(72) Inventors: Hongyang Gu, Shenzhen (CN); Zhongwei Sun, Shenzhen (CN); Yanjun Zhu, Shenzhen (CN); Yingjie Han, Shenzhen (CN); Huajun Yu, Shenzhen (CN)

(73) Assignee: SHENZHEN HELLO TECH ENERGY CO., LTD, Shenzhen (CN)

( * ) Notice: Subject to any disclaimer, the term of this patent is extended or adjusted under 35 U.S.C. 154(b) by 0 days.

(21) Appl. No.: 19/230,142

(22) Filed: Jun. 6, 2025

(65) Prior Publication Data

US 2025/0301801 A1 Sep. 25, 2025

Related U.S. Application Data

(63) Continuation of application No. PCT/CN2024/144364, filed on Dec. 31, 2024.

(30) Foreign Application Priority Data

Jun. 6, 2024 (CN) ........................ 202410733155.X

(51) Int. Cl.
*H10F 19/80* (2025.01)

(52) U.S. Cl.
CPC .................................. *H10F 19/807* (2025.01)

(58) Field of Classification Search
CPC ...... H10F 19/807; H10F 19/80; H10F 19/804; Y02B 10/10
USPC .......................................................... 156/212
See application file for complete search history.

(56) References Cited

U.S. PATENT DOCUMENTS

2008/0302408 A1 12/2008 Bressler et al.
2012/0085392 A1 4/2012 Albert et al.
2023/0275168 A1* 8/2023 Cao ........................ H10F 19/40 136/251

FOREIGN PATENT DOCUMENTS

CN 109383115 A 2/2019
CN 110289330 A 9/2019
CN 113809193 A 12/2021
CN 117012849 A 11/2023
(Continued)

OTHER PUBLICATIONS

Translation CN110289330 (Year: 2019).*
(Continued)

*Primary Examiner* — James D Sells

(57) ABSTRACT

Provided are a method for processing a curved photovoltaic tile, and a curved photovoltaic tile. The method for processing the curved photovoltaic tile, includes: stacking a first adhesive film layer, a solar cell, and a first protective layer on each other in sequence; performing a primary lamination on the first adhesive film layer, the solar cell, and the first protective layer to form a planar laminated assembly; stacking a rigid curved second protective layer, a second adhesive film layer, and the laminated assembly on each other in sequence; and performing a secondary lamination on the second protective layer, the second adhesive film layer, and the laminated assembly to form the curved photovoltaic tile.

18 Claims, 6 Drawing Sheets

(56) References Cited

FOREIGN PATENT DOCUMENTS

KR 20180018609 A 2/2018

OTHER PUBLICATIONS

Translation CN113809193 (Year: 2021).*
Translation CN117012849 (Year: 2023).*
International Search Report dated Apr. 3, 2025 in International Application No. PCT/CN2024/144364. English translation attached.
First Office Action dated Jul. 8, 2026 received in corresponding patent family application No. CN202410733155.X. English translation attached.

* cited by examiner

METHOD FOR PROCESSING CURVED PHOTOVOLTAIC TILE, AND CURVED PHOTOVOLTAIC TILE

CROSS-REFERENCE TO RELATED APPLICATION

This application is a continuation of International Application No. PCT/CN2024/144364, filed on Dec. 31, 2024, which claims priority to and benefits of Chinese patent application No. 202410733155.X filed with China National Intellectual Property Administration on Jun. 6, 2024, each of which is incorporated by reference in its entirety.

FIELD

The present disclosure relates to the field of photovoltaic device technologies, and specifically, to a method for processing a curved photovoltaic tile, and a curved photovoltaic tile.

BACKGROUND

In the related art, dual-sided power-generating photovoltaic tiles typically use silicon crystalline cells having low strength, which makes the cells prone to breakage.

SUMMARY

The present disclosure aims to solve at least one of the technical problems in the prior art or the related art.

To this end, a first objective of the present disclosure is to provide a method for processing a curved photovoltaic tile.

A second objective of the present disclosure is to provide a curved photovoltaic tile.

To achieve at least one of the above objectives, in a first aspect of the present disclosure, a method for processing a curved photovoltaic tile is provided. The method for processing the curved photovoltaic tile includes: stacking a first adhesive film layer, a solar cell, and a first protective layer on each other in sequence; performing a primary lamination on the first adhesive film layer, the solar cell, and the first protective layer to form a planar laminated assembly; stacking a rigid curved second protective layer, a second adhesive film layer, and the laminated assembly on each other in sequence; and performing a secondary lamination on the second protective layer, the second adhesive film layer, and the laminated assembly to form the curved photovoltaic tile.

The method for processing the curved photovoltaic tile of the present disclosure is applied in processing the curved photovoltaic tile. With the method, the curved photovoltaic tile is processed through two-step lamination. The first adhesive film layer, the solar cell, and the first protective layer are stacked on each other in sequence. The primary lamination is performed on the first adhesive film layer, the solar cell, and the first protective layer to form the planar laminated assembly. Specifically, the primary lamination may be performed on the first adhesive film layer, the solar cell, and the first protective layer using a first laminator. During the primary lamination, the first adhesive film layer softens upon heating and adheres to the solar cell. Part of the first protective layer also softens upon heating, and the solar cell is embedded in the first protective layer under pressure, allowing the solar cell and the first protective layer to be cured into an integral body. Therefore, strength of the solar cell is enhanced.

Further, the rigid curved second protective layer, the second adhesive film layer, and the laminated assembly are stacked on each other in sequence. The secondary lamination is performed on the second protective layer, the second adhesive film layer, and the laminated assembly. During the secondary lamination, the second adhesive film layer softens upon heating and adheres to the first adhesive film layer in the laminated assembly. The second protective layer is adhered to the laminated assembly through the second adhesive film layer, forming the curved photovoltaic tile.

By processing the curved photovoltaic tile using the above method, the curved photovoltaic tile can be processed and formed using the two-stage lamination. Compared with a processing method using single-step lamination, the method of the present disclosure enhances bending resistance of the solar cell, which reduces a probability of micro-cracks in the solar cell, improving stability and reliability of the curved photovoltaic tile.

In some technical solutions, in an implementation, the first protective layer includes a hard protective layer and an adhesive layer, and the performing the primary lamination on the first adhesive film layer, the solar cell, and the first protective layer includes: pressing the solar cell into the adhesive layer, allowing the solar cell and the adhesive layer to be cured into an integral body; and adhering the first adhesive film layer to the adhesive layer.

In these technical solutions, the method for processing the curved photovoltaic tile is further limited. The first protective layer includes the hard protective layer and the adhesive layer. The operation of performing the primary lamination on the first adhesive film layer, the solar cell, and the first protective layer is specifically carried out as follows. The solar cell is pressed into the adhesive layer, allowing the solar cell and the adhesive layer to be cured into the integral body. The first adhesive film layer is adhered to the adhesive layer.

Specifically, the adhesive layer is in a soft state at ambient temperature, which facilitates embedding of the solar cell in the adhesive layer. Subsequent to the embedding of the solar cell in the adhesive layer under pressure, the adhesive layer can be cured through heating the adhesive layer, causing the solar cell and the adhesive layer to be cured into the integral body. In this way, the strength of the solar cell is enhanced through the adhesive layer. The adhesive layer is located on a side of the hard protective layer facing towards the first adhesive film layer. Subsequent to the adhesive layer being heated and cured, the adhesive layer and the first adhesive film layer are adhered to each other, enabling the first adhesive film layer to adhere the first protective layer and the second protective layer together as an integral body.

By disposing the hard protective layer and the adhesive layer in the first protective layer, the solar cell can be embedded in the adhesive layer, allowing the solar cell and the adhesive layer to be cured into the integral body, thereby enhancing the strength of the solar cell. In addition, the hard protective layer provides further protection for the solar cell, improving the stability and the reliability of the curved photovoltaic tile.

In some technical solutions, in an implementation, the stacking the rigid curved second protective layer, the second adhesive film layer, and the laminated assembly on each other in sequence includes: stacking the second protective layer and the second adhesive film layer on each other; and placing the laminated assembly above the second adhesive film layer with the first adhesive film layer in the laminated assembly facing towards the second adhesive film layer.

In these technical solutions, the operation of stacking the rigid curved second protective layer, the second adhesive film layer, and the laminated assembly on each other in sequence is specifically limited. The second protective layer and the second adhesive film layer are stacked on each other. The laminated assembly is placed above the second adhesive film layer with the first adhesive film layer in the laminated assembly facing towards the second adhesive film layer. In this way, subsequent to the secondary lamination, the second protective layer is adhered to the first adhesive film layer in the laminated assembly through the second adhesive film layer, in such a manner that the first protective layer, the solar cell, the first adhesive film layer, the second adhesive film layer, and the second protective layer become an integral body, forming the curved photovoltaic tile. The first laminator may be a planar laminator.

In some technical solutions, in an implementation, the primary lamination is performed by a first laminator, and the performing the primary lamination on the first adhesive film layer, the solar cell, and the first protective layer includes: controlling a heating device of the first laminator to heat an interior of the first laminator to a temperature ranging from 145° C. to 150° C.; controlling an air-extracting device of the first laminator to vacuumize the interior of the first laminator, where an operation duration of the air-extracting device of the first laminator ranges from 360 s to 720 s; controlling the first laminator to laminate the first adhesive film layer, the solar cell, and the first protective layer at a first pressure for a first duration, where the first pressure ranges from 20 kPa to 30 kPa, and the first duration ranges from 30 s to 60 s; controlling the first laminator to laminate the first adhesive film layer, the solar cell, and the first protective layer at a second pressure for a second duration, where the second pressure ranges from 40 kPa to 50 kPa, and the second duration ranges from 30 s to 60 s; and controlling the first laminator to laminate the first adhesive film layer, the solar cell, and the first protective layer at a third pressure for a third duration, where the third pressure ranges from 95 kPa to 100 kPa, and the third duration ranges from 30 min to 40 min.

In these technical solutions, the method for processing the curved photovoltaic tile is further limited. The curved photovoltaic tile is subjected to the primary lamination by the first laminator. The operation of performing the primary lamination on the first adhesive film layer, the solar cell, and the first protective layer is specifically carried out as follows. The heating device of the first laminator is controlled to heat the interior of the first laminator to the temperature ranging from 145° C. to 150° C. The air-extracting device of the first laminator is controlled to vacuumize the interior of the first laminator, where the operation duration of the air-extracting device of the first laminator ranges from 360 s to 720 s. Then, the first adhesive film layer, the solar cell, and the first protective layer are laminated at different pressures for different durations.

Specifically, the first laminator is controlled to laminate the first adhesive film layer, the solar cell, and the first protective layer at the first pressure for the first duration, where the first pressure ranges from 20 kPa to 30 kPa, and the first duration ranges from 30 s to 60 s. The first laminator is controlled to laminate the first adhesive film layer, the solar cell, and the first protective layer at the second pressure for the second duration, where the second pressure ranges from 40 kPa to 50 kPa, and the second duration ranges from 30 s to 60 s. The first laminator is controlled to laminate the first adhesive film layer, the solar cell, and the first protective layer at the third pressure for the third duration, where the third pressure ranges from 95 kPa to 100 kPa, and the third duration ranges from 30 min to 40 min.

By laminating the first adhesive film layer, the solar cell, and the first protective layer at different pressures for different durations, the solar cell can be embedded in the first protective layer, allowing the first protective layer and the solar cell to be cured into an integral body, thereby enhancing the strength of the solar cell through the first protective layer.

In some technical solutions, in an implementation, the secondary lamination is performed by a second laminator, and the performing the secondary lamination on the second protective layer, the second adhesive film layer, and the laminated assembly includes: controlling an air-extracting device of the second laminator to vacuumize an interior of the second laminator, where an operation duration of the air-extracting device of the second laminator ranges from 10 min to 12 min; controlling a heating device of the second laminator to heat the interior of the second laminator to a temperature ranging from 80° C. to 90° C.; controlling the second laminator to laminate the second protective layer, the second adhesive film layer, and the laminated assembly at a fourth pressure for a fourth duration, where the fourth pressure ranges from 99 kPa to 100 kPa, and the fourth duration ranges from 5 min to 10 min; controlling the heating device of the second laminator to heat the interior of the second laminator to a temperature ranging from 100° C. to 110° C.; controlling the second laminator to laminate the second protective layer, the second adhesive film layer, and the laminated assembly at the fourth pressure for the fourth duration; controlling the heating device of the second laminator to heat the interior of the second laminator to a temperature ranging from 120° C. to 130° C.; controlling the second laminator to laminate the second protective layer, the second adhesive film layer, and the laminated assembly at the fourth pressure for the fourth duration; controlling the heating device of the second laminator to heat the interior of the second laminator to a temperature ranging from 150° C. to 160° C.; and controlling the second laminator to laminate the second protective layer, the second adhesive film layer, and the laminated assembly at the fourth pressure for a fifth duration, where the fifth duration ranges from 40 min to 60 min.

In these technical solutions, the method for processing the curved photovoltaic tile is further defined. The curved photovoltaic tile is further subjected to the secondary lamination by the second laminator. The operation of performing the secondary lamination on the second protective layer, the second adhesive film layer, and the laminated assembly is specifically carried out as follows. The air-extracting device of the second laminator is controlled to vacuumize the interior of the second laminator, where the operation duration of the air-extracting device of the second laminator ranges from 10 min to 12 min. Then, the laminated assembly, the second adhesive film layer, and the second protective layer are laminated at different pressures and different temperatures for varying durations. The second laminator may be a silicone bag laminator.

Specifically, the heating device of the second laminator is controlled to heat the interior of the second laminator to the temperature ranging from 80° C. to 90° C. The second laminator is controlled to laminate the second protective layer, the second adhesive film layer, and the laminated assembly at the fourth pressure for the fourth duration, where the fourth pressure ranges from 99 kPa to 100 kPa, and the fourth duration ranges from 5 min to 10 min. The heating device of the second laminator is controlled to heat the interior of the second laminator to the temperature ranging from 100° C. to 110° C. The second laminator is controlled to laminate the second protective layer, the second adhesive film layer, and the laminated assembly at the fourth pressure for the fourth duration. The heating device of the second laminator is controlled to heat the interior of the second laminator to the temperature ranging from 120° C. to 130° C. The second laminator is controlled to laminate the second protective layer, the second adhesive film layer, and the laminated assembly at the fourth pressure for the fourth duration. The heating device of the second laminator is controlled to heat the interior of the second laminator to the temperature ranging from 150° C. to 160° C. The second laminator is controlled to laminate the second protective layer, the second adhesive film layer, and the laminated assembly at the fourth pressure for the fifth duration, where the fifth duration ranges from 40 min to 60 min.

By laminating the laminated assembly, the second adhesive film layer, and the second protective layer at different pressures and different temperatures for varying durations, the laminated assembly, the second adhesive film layer, and the second protective layer can be formed into an integral body to form the curved photovoltaic tile.

In a second aspect of the present disclosure, a curved photovoltaic tile is provided. The curved photovoltaic tile includes: a solar cell configured to convert light energy into electrical energy, the solar cell having a backlit side and a light-receiving side that face away from each other; a first protective layer partially located on the backlit side of the solar cell; a first adhesive film layer located on the light-receiving side of the solar cell; a second protective layer located on a side of the first adhesive film layer facing away from the solar cell; and a second adhesive film layer located between the second protective layer and the first adhesive film layer.

The curved photovoltaic tile of the present disclosure includes the solar cell, the first protective layer, the second protective layer, the first adhesive film layer, and the second adhesive film layer. The solar cell is configured to receive light and convert the light energy into the electrical energy. Each of the first protective layer and the second protective layer is used to protect the solar cell. The first adhesive film layer and the second adhesive film layer are used to adhere the first protective layer to the second protective layer, forming the solar cell, the first protective layer, and the second protective layer into an integral body.

Specifically, the solar cell has the backlit side and the light-receiving side that face away from each other. Both the light-receiving side and the backlit side can receive light, allowing the solar cell to achieve dual-sided power generation. The solar cell may be a crystalline silicon cell or a thin-film cell.

Further, the first protective layer is optically transmissive, and thus light can pass through the first protective layer to reach the backlit side, enabling the backlit side to receive the light. The solar cell is embedded in the first protective layer, with part of the first protective layer located on the backlit side of the solar cell. The solar cell is cured together with the first protective layer into the integral body, which enhances the strength of the solar cell through the first protective layer, reducing the probability of micro-cracks in the solar cell.

Further, the first adhesive film layer is located on the light-receiving side of the solar cell. The second adhesive film layer is located between the second protective layer and the first adhesive film layer. The second protective layer is located on the side of the first adhesive film layer facing away from the solar cell. The second protective layer is adhered to the first protective layer through the first adhesive film layer and the second adhesive film layer, further protecting the solar cell through the second protective layer. Specifically, the light-receiving side of the solar cell faces towards the second protective layer. The second protective layer is optically transmissive, and thus light can pass through the second protective layer to reach the light-receiving side, enabling the light-receiving side to receive the light. In this way, a technical effect of dual-sided power generation by the solar cell can be realized. The second protective layer may be made of tempered glass.

Further, in the processing of the curved photovoltaic tile, the first protective layer, the solar cell, and the first adhesive film layer are subjected to the primary lamination, in such a manner that the solar cell is pressed into the first protective layer and the first adhesive film layer is adhered to the first protective layer. Consequently, the first protective layer, the solar cell, and the first adhesive film layer are laminated into an integral body, forming the laminated assembly. The secondary lamination is performed subsequent to placing the second adhesive film layer between the second protective layer and the laminated assembly, in such a manner that the second protective layer is adhered to the laminated assembly through the second adhesive film layer. Consequently, the first protective layer, the solar cell, the first adhesive film layer, the second adhesive film layer, and the second protective layer are formed into the integral body, forming the curved photovoltaic tile.

Each of the first adhesive film layer and the second adhesive film layer may be made of ethylene vinyl acetate polymer (EVA), polyethylene (POE), polyvinyl butyral (PVB), organic silicone rubber, or the like.

By disposing the first adhesive film layer and the second adhesive film layer in the curved photovoltaic tile, the curved photovoltaic tile can be processed using the two-step lamination. Compared with the conventional processing method using the single-step lamination, the method of the present disclosure enhances the bending resistance of the solar cell, which reduces the probability of micro-cracks in the solar cell, improving the stability and the reliability of the curved photovoltaic tile.

The curved photovoltaic tile of the present disclosure can further provide the following distinguishing technical features.

In some technical solutions, in an implementation, the first protective layer includes: a hard protective layer; and an adhesive layer located on a side of the hard protective layer facing towards the first adhesive film layer, the solar cell being embedded in the adhesive layer, and the first adhesive film layer being adhered to the adhesive layer.

In these technical solutions, a structure of the first protective layer is limited. The first protective layer includes the hard protective layer and the adhesive layer. The hard protective layer and the adhesive layer are stacked on each other. The solar cell is embedded in the adhesive layer. Specifically, the adhesive layer is in a soft state at ambient temperature, which facilitates the embedding of the solar cell in the adhesive layer. Subsequent to the embedding of the solar cell in the adhesive layer under pressure, the adhesive layer can be cured through heating the adhesive layer, causing the solar cell to cure together with the adhesive layer as the integral body. In this way, the strength of the solar cell is enhanced through the adhesive layer. The adhesive layer is located on the side of the hard protective layer facing towards the first adhesive film layer. Subsequent to the adhesive layer being heated and cured, the adhesive layer and the first adhesive film layer are adhered to each other, enabling the first adhesive film layer to adhere the first protective layer and the second protective layer together as the integral body.

Both the adhesive layer and the hard protective layer are optically transmissive, allowing the solar cell to receive the light normally. The adhesive layer has a thickness ranging from 0.2 mm to 0.5 mm, while the hard protective layer has a thickness ranging from 0.2 mm to 0.7 mm. The adhesive layer is made of resin. The hard protective layer is made of polyethylene terephthalate (PET).

By disposing the hard protective layer and the adhesive layer in the first protective layer, the solar cell can be embedded in the adhesive layer, allowing the solar cell and the adhesive layer to be cured into the integral body, thereby enhancing the strength of the solar cell. In addition, the hard protective layer provides further protection for the solar cell, improving the stability and the reliability of the curved photovoltaic tile.

In some technical solutions, in an implementation, the adhesive layer is made of resin.

In these technical solutions, the adhesive layer is limited. Specifically, the adhesive layer is made of resin, which is soft at ambient temperature and cures when heated. The cured resin has high strength. During lamination of the solar cell with the first protective layer, the solar cell is pressed into the adhesive layer under pressure. Then, the adhesive layer is heated to be cured, enabling the solar cell and the adhesive layer to be cured into the integral body. The cured adhesive layer has high strength, which can enhance the strength of the solar cell, reducing the probability of micro-cracks in the solar cell.

In some technical solutions, in an implementation, each of the solar cell, the first protective layer, and the second protective layer has a curved surface.

In these technical solutions, the solar cell, the first protective layer, and the second protective layer are further limited. Specifically, each of the solar cell, the first protective layer, and the second protective layer has the curved surface, making the curved photovoltaic tile a curved product. In this way, not only aesthetic appeal of the curved photovoltaic tile is improved, but also the curved photovoltaic tile can be applied in a wider variety of photovoltaic devices.

In some technical solutions, in an implementation, each of the first adhesive film layer and the second adhesive film layer is optically transmissive.

In these technical solutions, the first adhesive film layer and the second adhesive film layer are further limited. Specifically, each of the first adhesive film layer and the second adhesive film layer is optically transmissive, which allows the light to pass through the first adhesive film layer and the second adhesive film layer in sequence to reach the solar cell, allowing the solar cell to achieve the dual-sided power generation.

By designing both the first adhesive film layer and the second adhesive film layer to be optically transmissive, the light can pass through the first adhesive film layer and the second adhesive film layer, allowing the solar cell to achieve the dual-sided power generation. Additional aspects and advantages of the present disclosure will be provided at least in part in the following description, or will become apparent at least in part from the following description, or can be learned from practicing of the present disclosure.

BRIEF DESCRIPTION OF THE DRAWINGS

The above and/or additional aspects and advantages of the present disclosure will become more apparent and more understandable from the following description of embodiments taken in conjunction with the accompanying drawings.

Figure 1:
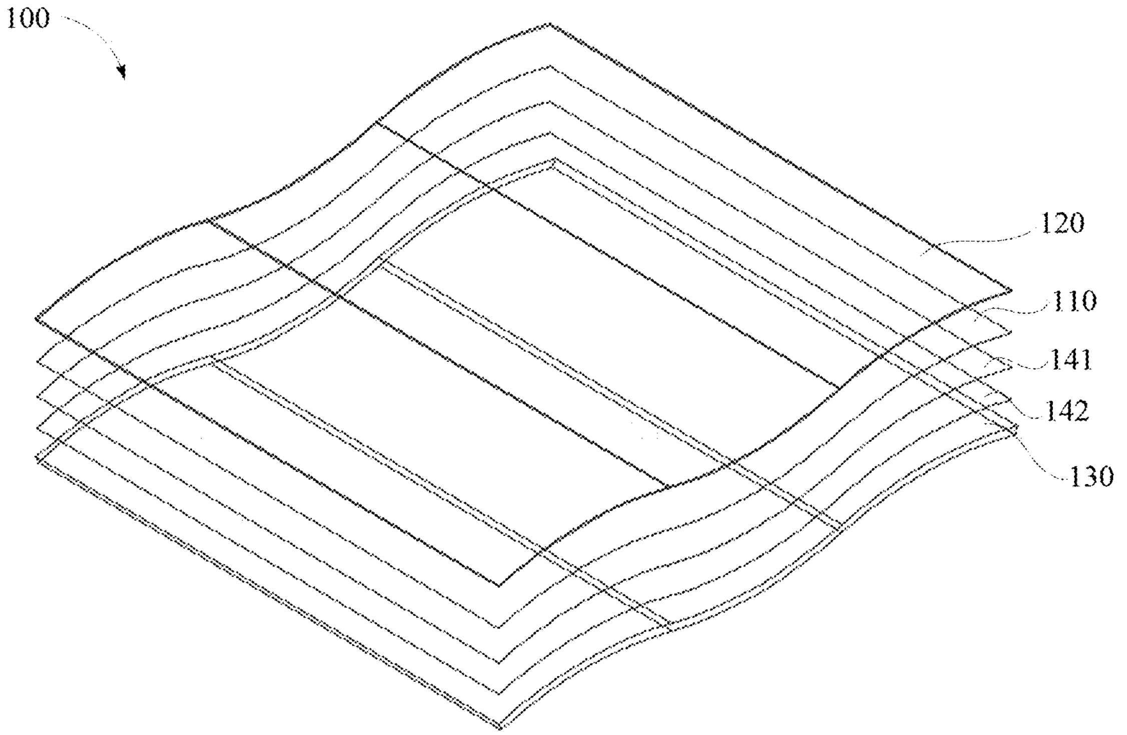
FIG. 1 illustrates a first exploded view of a curved photovoltaic tile according to an embodiment of the present disclosure.

A correspondence between reference numerals and component names in FIG. 1 to FIG. 6 is as follows:

100: curved photovoltaic tile; 110: solar cell; 111: backlit side; 112: light-receiving side; 120: first protective layer; 121: hard protective layer; 122: adhesive layer; 130: second protective layer; 141: first adhesive film layer; 142: second adhesive film layer; 150: laminated assembly.

DETAILED DESCRIPTION

Embodiments of the present disclosure will be described in detail below with reference to examples thereof as illustrated in the accompanying drawings, throughout which same or similar elements, or elements having same or similar functions, are denoted by same or similar reference numerals. The embodiments described below with reference to the drawings are illustrative only, and are intended to explain, rather than limit, the present disclosure.

Various embodiments or examples for implementing different structures of the embodiments of the present disclosure are provided below. In order to simplify the description of the embodiments of the present disclosure, components and arrangements of specific examples are described herein. These specific examples are merely for the purpose of illustration, rather than limiting the present disclosure. Further, the same reference numerals and/or reference letters may appear in different examples of the embodiments of the present disclosure for the purpose of simplicity and clarity, instead of indicating a relationship between different embodiments and/or the discussed arrangements. In addition, the embodiments of the present disclosure provide examples of various specific processes and materials. However, applications of other processes and/or the use of other materials are conceivable for those of ordinary skill in the art.

A method for processing a curved photovoltaic tile and a curved photovoltaic tile 100 according to some embodiments of the present disclosure is described below with reference to FIG. 1 to FIG. 11.

Figure 7:
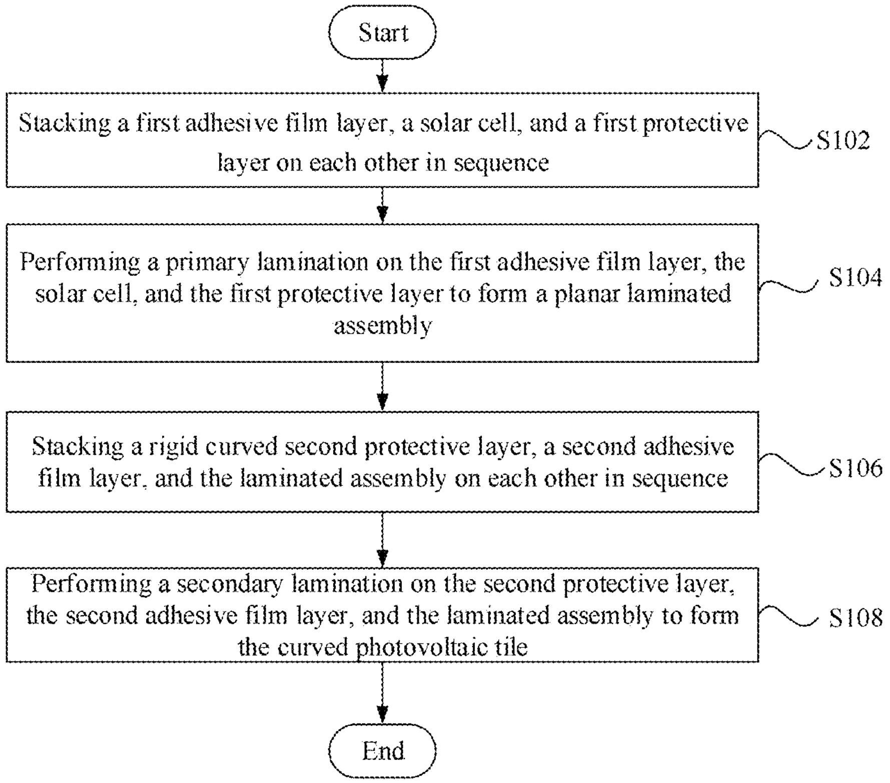
FIG. 7 illustrates a first flowchart of a method for processing a curved photovoltaic tile according to an embodiment of the present disclosure.

In an embodiment of the present disclosure, as illustrated in FIG. 7, a first flowchart of a method for processing a curved photovoltaic tile according to an embodiment of the present disclosure is illustrated. The method includes operations at blocks S102 to S108.

At S102, a first adhesive film layer, a solar cell, and a first protective layer are stacked on each other in sequence.

At S104, a primary lamination is performed on the first adhesive film layer, the solar cell, and the first protective layer to form a planar laminated assembly.

At S106, a rigid curved second protective layer, a second adhesive film layer, and the laminated assembly are stacked on each other in sequence.

At S108, a secondary lamination is performed on the second protective layer, the second adhesive film layer, and the laminated assembly to form the curved photovoltaic tile.

The method for processing the curved photovoltaic tile of the present disclosure is applied in processing the curved photovoltaic tile. With the method, the curved photovoltaic tile is processed through two-step lamination. The first adhesive film layer, the solar cell, and the first protective layer are stacked on each other in sequence. The primary lamination is performed on the first adhesive film layer, the solar cell, and the first protective layer to form the planar laminated assembly. Specifically, the primary lamination may be performed on the first adhesive film layer, the solar cell, and the first protective layer using a first laminator. During the primary lamination, the first adhesive film layer softens upon heating and adheres to the solar cell. Part of the first protective layer also softens upon heating, and the solar cell is embedded in the first protective layer under pressure, allowing the solar cell and the first protective layer to cured into an integral body. Therefore, strength of the solar cell is enhanced.

Further, the rigid curved second protective layer, the second adhesive film layer, and the laminated assembly are stacked on each other in sequence. The secondary lamination is performed on the second protective layer, the second adhesive film layer, and the laminated assembly. During the secondary lamination, the second adhesive film layer softens upon heating and adheres to the first adhesive film layer in the laminated assembly. The second protective layer is adhered to the laminated assembly through the second adhesive film layer, forming the curved photovoltaic tile.

By processing the curved photovoltaic tile using the above method, the curved photovoltaic tile can be processed and formed using the two-step lamination. Compared with a processing method using single-stage lamination, the method of the present disclosure enhances bending resistance of the solar cell, which reduces a probability of micro-cracks in the solar cell, improving stability and reliability of the curved photovoltaic tile.

Figure 3:
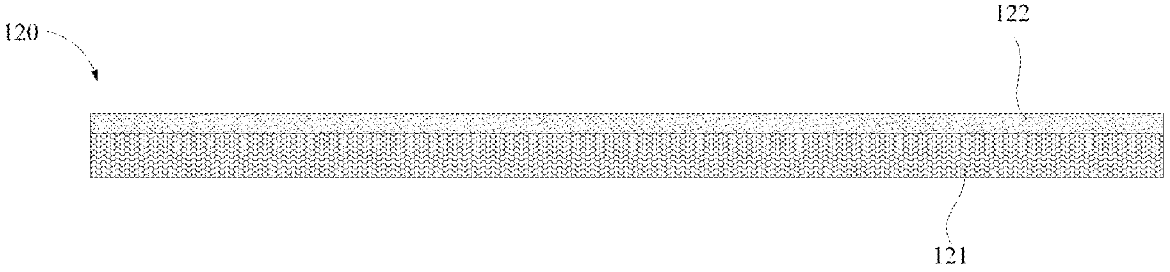
FIG. 3 illustrates a schematic structural view of a first protective layer according to an embodiment of the present disclosure.
Figure 8:
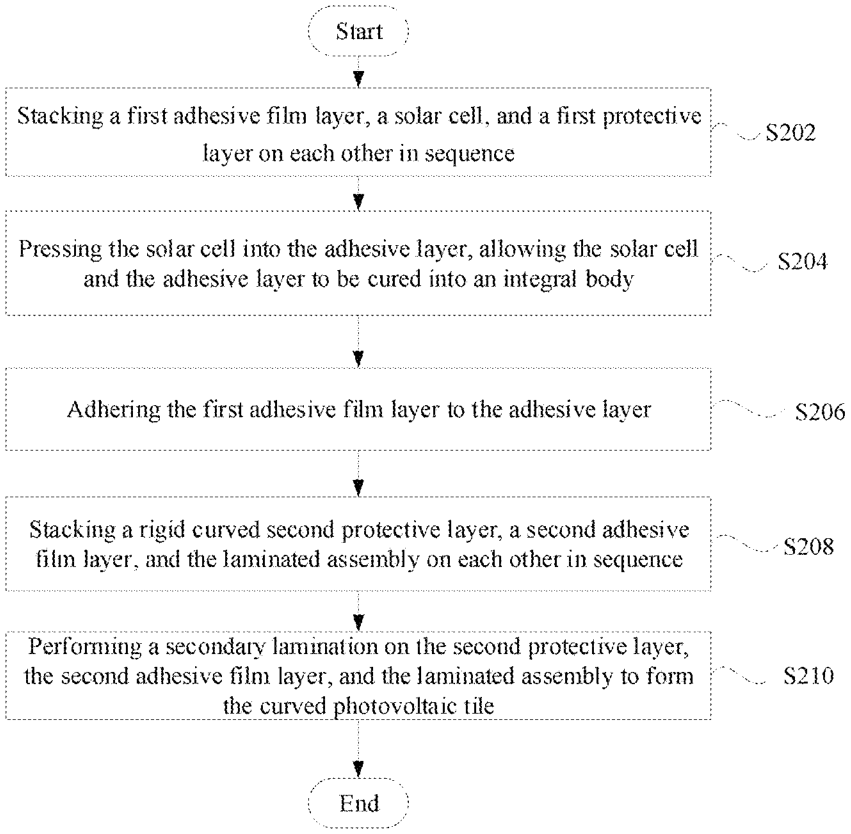
FIG. 8 illustrates a second flowchart of a method for processing a curved photovoltaic tile according to an embodiment of the present disclosure.

In an embodiment of the present disclosure, as illustrated in FIG. 3, the first protective layer 120 includes a hard protective layer 121 and an adhesive layer 122. As illustrated in FIG. 8, a second flowchart of a method for processing a curved photovoltaic tile according to an embodiment of the present disclosure is illustrated. The method includes operations at blocks S202 to S210.

At S202, a first adhesive film layer, a solar cell, and a first protective layer are stacked on each other in sequence.

At S204, the solar cell is pressed into the adhesive layer, allowing the solar cell and the adhesive layer to be cured into an integral body.

At S206, the first adhesive film layer is adhered to the adhesive layer.

At S208, a rigid curved second protective layer, a second adhesive film layer, and the laminated assembly are stacked on each other in sequence.

At S210, a secondary lamination is performed on the second protective layer, the second adhesive film layer, and the laminated assembly to form the curved photovoltaic tile.

In this embodiment, the method for processing the curved photovoltaic tile is further limited. The first protective layer includes the hard protective layer and the adhesive layer. The operation of performing the primary lamination on the first adhesive film layer, the solar cell, and the first protective layer is specifically carried out as follows. The solar cell is pressed into the adhesive layer, allowing the solar cell and the adhesive layer to be cured into the integral body. The first adhesive film layer is adhered to the adhesive layer.

Specifically, the adhesive layer is in a soft state at ambient temperature, which facilitates embedding of the solar cell in the adhesive layer. Subsequent to the embedding of the solar cell in the adhesive layer under pressure, the adhesive layer can be cured through heating the adhesive layer, causing the solar cell to cure together with the adhesive layer as the integral body. In this way, the strength of the solar cell is enhanced through the adhesive layer. The adhesive layer is located on a side of the hard protective layer facing towards the first adhesive film layer. Subsequent to the adhesive layer being heated and cured, the adhesive layer and the first adhesive film layer are adhered to each other, enabling the first adhesive film layer to adhere the first protective layer and the second protective layer together as an integral body.

By disposing the hard protective layer and the adhesive layer in the first protective layer, the solar cell can be embedded in the adhesive layer, allowing the solar cell and the adhesive layer to be cured into the integral body, thereby enhancing the strength of the solar cell. In addition, the hard protective layer provides further protection for the solar cell, improving the stability and the reliability of the curved photovoltaic tile.

Figure 9:
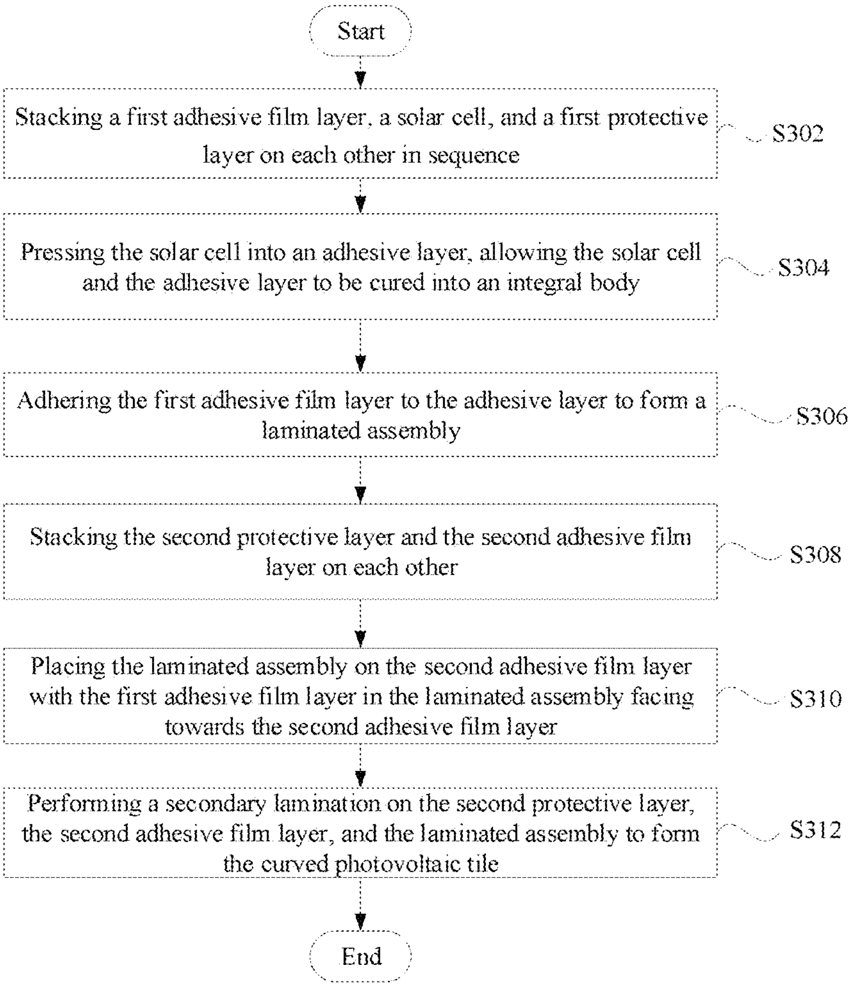
FIG. 9 illustrates a third flowchart of a method for processing a curved photovoltaic tile according to an embodiment of the present disclosure.

In an embodiment of the present disclosure, as illustrated in FIG. 9, a third flowchart of a method for processing a curved photovoltaic tile according to an embodiment of the present disclosure is illustrated. The method includes operations at blocks S302 to S312.

At S302, a first adhesive film layer, a solar cell, and a first protective layer are stacked on each other in sequence.

At S304, the solar cell is pressed into an adhesive layer, allowing the solar cell and the adhesive layer to be cured into an integral body.

At S306, the first adhesive film layer is adhered to the adhesive layer to form a laminated assembly.

At S308, the second protective layer and the second adhesive film layer are stacked on each other.

At S310, the laminated assembly is placed on the second adhesive film layer with the first adhesive film layer in the laminated assembly facing towards the second adhesive film layer.

At S312, a secondary lamination is performed on the second protective layer, the second adhesive film layer, and the laminated assembly to form the curved photovoltaic tile.

In this embodiment, the operation of stacking the rigid curved second protective layer, the second adhesive film layer, and the laminated assembly on each other in sequence is specifically limited. The second protective layer and the second adhesive film layer are stacked on each other. The laminated assembly is placed on the second adhesive film layer with the first adhesive film layer in the laminated assembly facing towards the second adhesive film layer. In this way, subsequent to the secondary lamination, the second protective layer is adhered to the first adhesive film layer in the laminated assembly through the second adhesive film layer, in such a manner that the first protective layer, the solar cell, the first adhesive film layer, the second adhesive film layer, and the second protective layer become an integral body, forming the curved photovoltaic tile. The first laminator may be a planar laminator.

Figure 10:
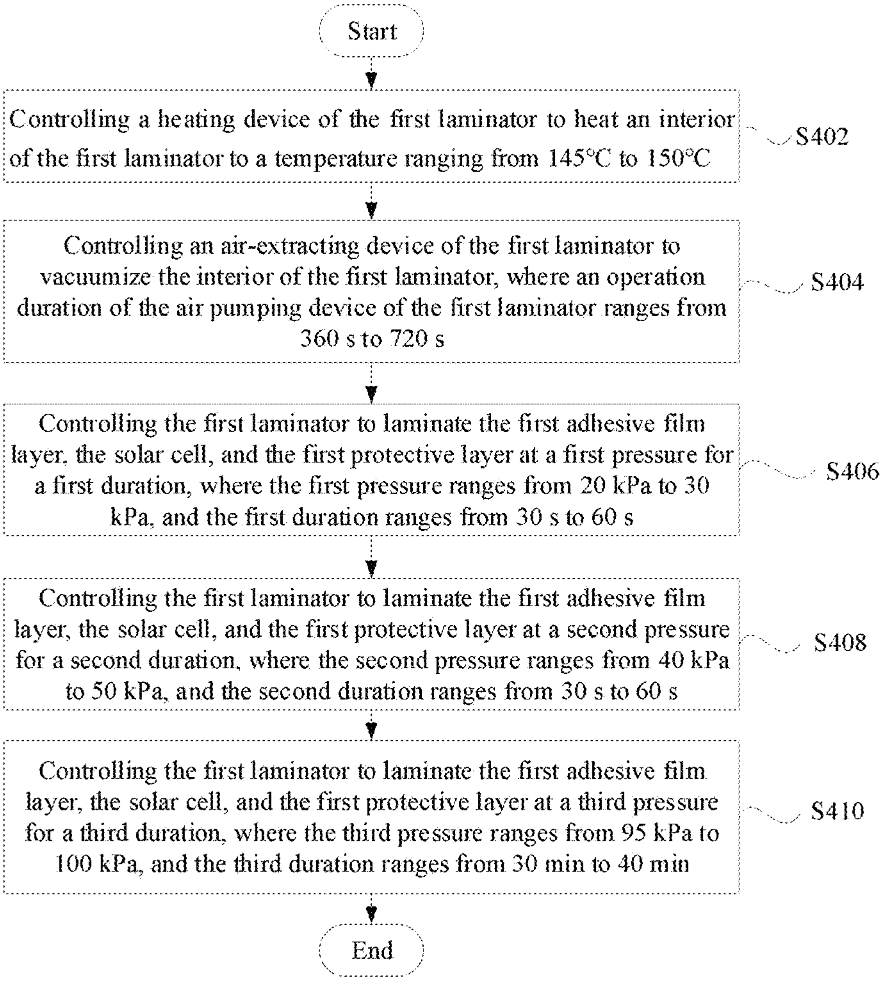
FIG. 10 illustrates a fourth flowchart of a method for processing a curved photovoltaic tile according to an embodiment of the present disclosure.

In an embodiment of the present disclosure, the curved photovoltaic tile is subjected to the primary lamination by a first laminator. As illustrated in FIG. 10, a fourth flowchart of a method for processing a curved photovoltaic tile according to an embodiment of the present disclosure is illustrated. The operation of performing the primary lamination on the first adhesive film layer, the solar cell, and the first protective layer includes operations at blocks S402 to S410.

At S402, a heating device of the first laminator is controlled to heat an interior of the first laminator to a temperature ranging from 145° C. to 150° C.

At S404, an air-extracting device of the first laminator is controlled to vacuumize the interior of the first laminator, where an operation duration of the air-extracting device of the first laminator ranges from 360 s to 720 s.

At S406, the first laminator is controlled to laminate the first adhesive film layer, the solar cell, and the first protective layer at a first pressure for a first duration, where the first pressure ranges from 20 kPa to 30 kPa, and the first duration ranges from 30 s to 60 s.

At S408, the first laminator is controlled to laminate the first adhesive film layer, the solar cell, and the first protective layer at a second pressure for a second duration, where the second pressure ranges from 40 kPa to 50 kPa, and the second duration ranges from 30 s to 60 s.

At S410, the first laminator is controlled to laminate the first adhesive film layer, the solar cell, and the first protective layer at a third pressure for a third duration, where the third pressure ranges from 95 kPa to 100 kPa, and the third duration ranges from 30 min to 40 min.

In this embodiment, the method for processing the curved photovoltaic tile is further limited. The curved photovoltaic tile is subjected to the primary lamination by the first laminator. The operation of performing the primary lamination on the first adhesive film layer, the solar cell, and the first protective layer is specifically carried out as follows. The heating device of the first laminator is controlled to heat the interior of the first laminator to the temperature ranging from 145° C. to 150° C. The air-extracting device of the first laminator is controlled to vacuumize the interior of the first laminator, where the operation duration of the air-extracting device of the first laminator ranges from 360 s to 720 s. Then, the first adhesive film layer, the solar cell, and the first protective layer are laminated at different pressures for different durations.

Specifically, the first laminator is controlled to laminate the first adhesive film layer, the solar cell, and the first protective layer at the first pressure for the first duration, where the first pressure ranges from 20 kPa to 30 kPa, and the first duration ranges from 30 s to 60 s. The first laminator is controlled to laminate the first adhesive film layer, the solar cell, and the first protective layer at the second pressure for the second duration, where the second pressure ranges from 40 kPa to 50 kPa, and the second duration ranges from 30 s to 60 s. The first laminator is controlled to laminate the first adhesive film layer, the solar cell, and the first protective layer at the third pressure for the third duration, where the third pressure ranges from 95 kPa to 100 kPa, and the third duration ranges from 30 min to 40 min.

By laminating the first adhesive film layer, the solar cell, and the first protective layer at different pressures for different durations, the solar cell can be embedded in the first protective layer, allowing the first protective layer and the solar cell to be cured into an integral body, thereby enhancing the strength of the solar cell through the first protective layer.

Figure 11:
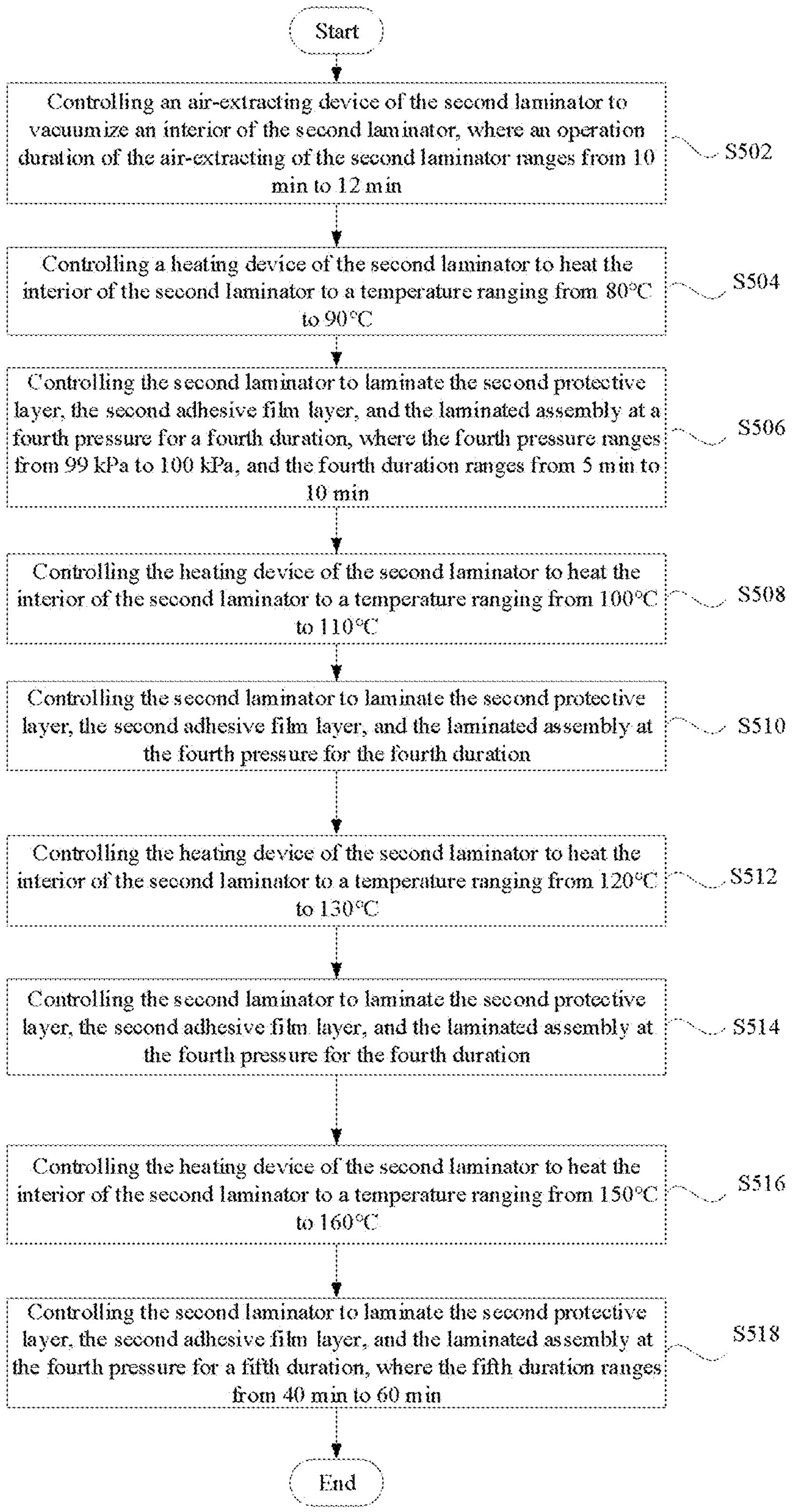
FIG. 11 illustrates a fifth flowchart of a method for processing a curved photovoltaic tile according to an embodiment of the present disclosure.

In an embodiment of the present disclosure, the curved photovoltaic tile is further subjected to the secondary lamination by a second laminator. As illustrated in FIG. 11, a fifth flowchart of a method for processing a curved photovoltaic tile according to an embodiment of the present disclosure is illustrated. The operation of performing the secondary lamination on the second protective layer, the second adhesive film layer, and the laminated assembly includes operations at blocks S502 to S518.

At S502, an air-extracting device of the second laminator is controlled to vacuumize an interior of the second laminator, where an operation duration of the air-extracting device of the second laminator ranges from 10 min to 12 min.

At S504, a heating device of the second laminator is controlled to heat the interior of the second laminator to a temperature ranging from 80° C. to 90° C.

At S506, the second laminator is controlled to laminate the second protective layer, the second adhesive film layer, and the laminated assembly at a fourth pressure for a fourth duration, where the fourth pressure ranges from 99 kPa to 100 kPa, and the fourth duration ranges from 5 min to 10 min.

At S508, the heating device of the second laminator is controlled to heat the interior of the second laminator to a temperature ranging from 100° C. to 110° C.

At S510, the second laminator is controlled to laminate the second protective layer, the second adhesive film layer, and the laminated assembly at the fourth pressure for the fourth duration.

At S512, the heating device of the second laminator is controlled to heat the interior of the second laminator to a temperature ranging from 120° C. to 130° C.

At S514, the second laminator is controlled to laminate the second protective layer, the second adhesive film layer, and the laminated assembly at the fourth pressure for the fourth duration.

At S516, the heating device of the second laminator is controlled to heat the interior of the second laminator to a temperature ranging from 150° C. to 160° C.

At S518, the second laminator is controlled to laminate the second protective layer, the second adhesive film layer, and the laminated assembly at the fourth pressure for a fifth duration, where the fifth duration ranges from 40 min to 60 min.

In this embodiment, the method for processing the curved photovoltaic tile is further defined. The curved photovoltaic tile is further subjected to the secondary lamination by the second laminator. The operation of performing the secondary lamination on the second protective layer, the second adhesive film layer, and the laminated assembly is specifically carried out as follows. The air-extracting device of the second laminator is controlled to vacuumize the interior of the second laminator, where the operation duration of the air-extracting device of the second laminator ranges from 10 min to 12 min. Then, the laminated assembly, the second adhesive film layer, and the second protective layer are laminated at different pressures and different temperatures for varying durations. The second laminator may be a silicone bag laminator.

Specifically, the heating device of the second laminator is controlled to heat the interior of the second laminator to the temperature ranging from 80° C. to 90° C. The second laminator is controlled to laminate the second protective layer, the second adhesive film layer, and the laminated assembly at the fourth pressure for the fourth duration, where the fourth pressure ranges from 99 kPa to 100 kPa, and the fourth duration ranges from 5 min to 10 min. The heating device of the second laminator is controlled to heat the interior of the second laminator to the temperature ranging from 100° C. to 110° C. The second laminator is controlled to laminate the second protective layer, the second adhesive film layer, and the laminated assembly at the fourth pressure for the fourth duration. The heating device of the second laminator is controlled to heat the interior of the second laminator to the temperature ranging from 120° C. to 130° C. The second laminator is controlled to laminate the second protective layer, the second adhesive film layer, and the laminated assembly at the fourth pressure for the fourth duration. The heating device of the second laminator is controlled to heat the interior of the second laminator to the temperature ranging from 150° C. to 160° C. The second laminator is controlled to laminate the second protective layer, the second adhesive film layer, and the laminated assembly at the fourth pressure for the fifth duration, where the fifth duration ranges from 40 min to 60 min.

By laminating the laminated assembly, the second adhesive film layer, and the second protective layer at different pressures and different temperatures for varying durations, the laminated assembly, the second adhesive film layer, and the second protective layer can be formed into an integral body to form the curved photovoltaic tile.

In an embodiment of the present disclosure, as illustrated in FIG. 1, FIG. 2, FIG. 4, and FIG. 5, a curved photovoltaic tile 100 is provided by the present disclosure. The curved photovoltaic tile 110 includes: a solar cell 110 configured to convert light energy into electrical energy, the solar cell 110 having a backlit side 111 and a light-receiving side 112 that face away from each other; a first protective layer 120 partially located on the backlit side 111 of the solar cell 110; a first adhesive film layer 141 located on the light-receiving side 112 of the solar cell 110; a second protective layer 130 located on a side of the first adhesive film layer 141 facing away from the solar cell 110; and a second adhesive film layer 142 located between the second protective layer 130 and the first adhesive film layer 141.

The curved photovoltaic tile 100 of the present disclosure includes the solar cell 110, the first protective layer 120, the second protective layer 130, the first adhesive film layer 141, and the second adhesive film layer 142. The solar cell 110 is configured to receive light and convert the light energy into the electrical energy. Each of the first protective layer 120 and the second protective layer 130 is used to protect the solar cell 110. The first adhesive film layer 141 and the second adhesive film layer 142 are used to adhere the first protective layer 120 to the second protective layer 130, forming the solar cell 110, the first protective layer 120, and the second protective layer 130 into an integral body.

Specifically, the solar cell 110 has the backlit side 111 and the light-receiving side 112 that face away from each other. Both the light-receiving side 112 and the backlit side 111 can receive light, allowing the solar cell 110 to achieve dual-sided power generation. The solar cell 110 may be a crystalline silicon cell or a thin-film cell.

Further, the first protective layer 120 is optically transmissive, and thus light can pass through the first protective layer 120 to reach the backlit side 111, enabling the backlit side 111 to receive the light. The solar cell 110 is embedded in the first protective layer 120, with part of the first protective layer 120 located on the backlit side 111 of the solar cell 110. The solar cell 110 is cured together with the first protective layer 120 into the integral body, which enhances the strength of the solar cell 110 through the first protective layer 120, reducing the probability of microcracks in the solar cell 110.

Further, the first adhesive film layer 141 is located on the light-receiving side 112 of the solar cell 110. The second adhesive film layer 142 is located between the second protective layer 130 and the first adhesive film layer 141. The second protective layer 130 is located on the side of the first adhesive film layer 141 facing away from the solar cell 110. The second protective layer 130 is adhered to the first protective layer 120 through the first adhesive film layer 141 and the second adhesive film layer 142, further protecting the solar cell 110 through the second protective layer 130. Specifically, the light-receiving side 112 of the solar cell 110 faces towards the second protective layer 130. The second protective layer 130 is optically transmissive, and thus light can pass through the second protective layer 130 to reach the light-receiving side 112, enabling the light-receiving side 112 to receive the light. In this way, a technical effect of dual-sided power generation by the solar cell 110 can be realized. The second protective layer 130 may be made of tempered glass.

Further, in the processing of the curved photovoltaic tile 100, the first protective layer 120, the solar cell 110, and the first adhesive film layer 141 are subjected to the primary lamination, in such a manner that the solar cell 110 is pressed into the first protective layer 120 and the first adhesive film layer 141 is adhered to the first protective layer 120. Consequently, the first protective layer 120, the solar cell 110, and the first adhesive film layer 141 are laminated into an integral body, forming the laminated assembly 150. The secondary lamination is performed subsequent to placing the second adhesive film layer 142 between the second protective layer 130 and the laminated assembly 150, in such a manner that the second protective layer 130 is adhered to the laminated assembly 150 through the second adhesive film layer 142. Consequently, the first protective layer 120, the solar cell 110, the first adhesive film layer 141, the second adhesive film layer 142, and the second protective layer 130 are formed into the integral body, forming the curved photovoltaic tile 100.

Each of the first adhesive film layer 141 and the second adhesive film layer 142 may be made of EVA, POE, PVB, organic silicone rubber, or the like.

By disposing the first adhesive film layer 141 and the second adhesive film layer 142 in the curved photovoltaic tile 100, the curved photovoltaic tile 100 can be processed using the two-step lamination. Compared with the conventional processing method using the single-step lamination, the method of the present disclosure enhances the bending resistance of the solar cell 110, which reduces the probability of micro-cracks in the solar cell 110, improving the stability and the reliability of the curved photovoltaic tile 100.

Figure 5:
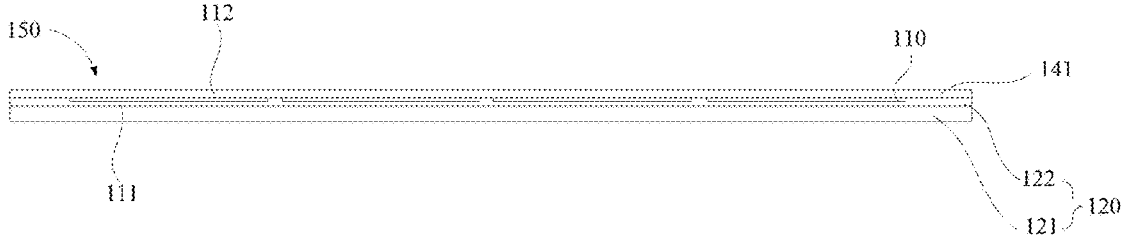
FIG. 5 illustrates a schematic structural view of a first protective layer, a solar cell, and a first adhesive film layer subsequent to a primary lamination according to an embodiment of the present disclosure.
Figure 6:
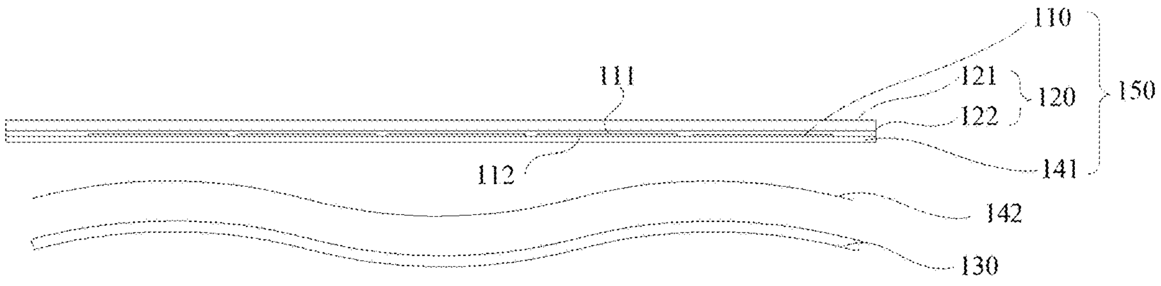
FIG. 6 illustrates a schematic structural view of a second protective layer, a second adhesive film layer, and a laminated assembly prior to a secondary lamination according to an embodiment of the present disclosure.

In some embodiments, in an implementation, as illustrated in FIG. 3 and FIG. 5, the first protective layer 120 includes: a hard protective layer 121; and an adhesive layer 122 located on a side of the hard protective layer 121 facing towards the first adhesive film layer 141. The solar cell 110 is embedded in the adhesive layer 122. The first adhesive film layer 141 is adhered to the adhesive layer 122.

In these embodiments, a structure of the first protective layer 120 is limited. The first protective layer 120 includes the hard protective layer 121 and the adhesive layer 122. The hard protective layer 121 and the adhesive layer 122 are stacked on each other. The solar cell 110 is embedded in the adhesive layer 122. Specifically, the adhesive layer 122 is in a soft state at ambient temperature, which facilitates the embedding of the solar cell 110 in the adhesive layer 122. Subsequent to the embedding of the solar cell 110 in the adhesive layer 122 under pressure, the adhesive layer 122 can be cured through heating the adhesive layer 122, causing the solar cell 110 to cure together with the adhesive layer 122 as the integral body. In this way, the strength of the solar cell 110 is enhanced through the adhesive layer 122. The adhesive layer 122 is located on the side of the hard protective layer 121 facing towards the first adhesive film layer 141. Subsequent to the adhesive layer 122 being heated and cured, the adhesive layer 122 and the first adhesive film layer 141 are adhered to each other, enabling the first adhesive film layer 141 to adhere the first protective layer 120 and the second protective layer 130 together as the integral body.

Both the adhesive layer 122 and the hard protective layer 121 are optically transmissive, allowing the solar cell 110 to receive the light normally. The adhesive layer 122 has a thickness ranging from 0.2 mm to 0.5 mm, while the hard protective layer 121 has a thickness ranging from 0.2 mm to 0.7 mm. The adhesive layer 122 is made of resin. The hard protective layer 121 is made of polyethylene terephthalate (PET).

By disposing the hard protective layer 121 and the adhesive layer 122 in the first protective layer 120, the solar cell 110 can be embedded in the adhesive layer 122, allowing solar cell 110 and the adhesive layer 122 to be cured into the integral body, enhancing the strength of the solar cell 110. In addition, the hard protective layer 121 provides further protection for the solar cell 110, improving the stability and the reliability of the curved photovoltaic tile 100.

In some embodiments, in an implementation, the adhesive layer 122 is made of resin.

In these embodiments, the adhesive layer 122 is limited. Specifically, the adhesive layer 122 is made of resin, which is soft at ambient temperature and cures when heated. The cured resin has high strength. During lamination of the solar cell 110 with the first protective layer 120, the solar cell 110 is pressed into the adhesive layer 122 under pressure. Then, the adhesive layer 122 is heated to be cured, enabling the solar cell 110 to cure together with the adhesive layer 122 into the integral body. The cured adhesive layer 122 has high strength, which can enhance the strength of the solar cell 110, reducing the probability of micro-cracks in the solar cell 110.

In some embodiments, in an implementation, each of the solar cell 110, the first protective layer 120, and the second protective layer 130 has a curved surface.

In these embodiments, the solar cell 110, the first protective layer 120, and the second protective layer 130 are further limited. Specifically, each of the solar cell 110, the first protective layer 120, and the second protective layer 130 has the curved surface, making the curved photovoltaic tile 100 a curved product. In this way, not only aesthetic appeal of the curved photovoltaic tile 100 is improved, but also the curved photovoltaic tile 100 can be applied in a wider variety of photovoltaic devices.

In some embodiments, in an implementation, each of the first adhesive film layer 141 and the second adhesive film layer 142 is optically transmissive.

In these embodiments, the first adhesive film layer 141 and the second adhesive film layer 142 are further limited. Specifically, each of the first adhesive film layer 141 and the second adhesive film layer 142 is optically transmissive, which allows the light to pass through the first adhesive film layer 141 and the second adhesive film layer 142 in sequence to reach the solar cell 110, allowing the solar cell 110 to achieve the dual-sided power generation.

By designing both the first adhesive film layer 141 and the second adhesive film layer 142 to be optically transmissive, the light can pass through the first adhesive film layer 141 and the second adhesive film layer 142, allowing the solar cell 110 to achieve the dual-sided power generation.

Figure 2:
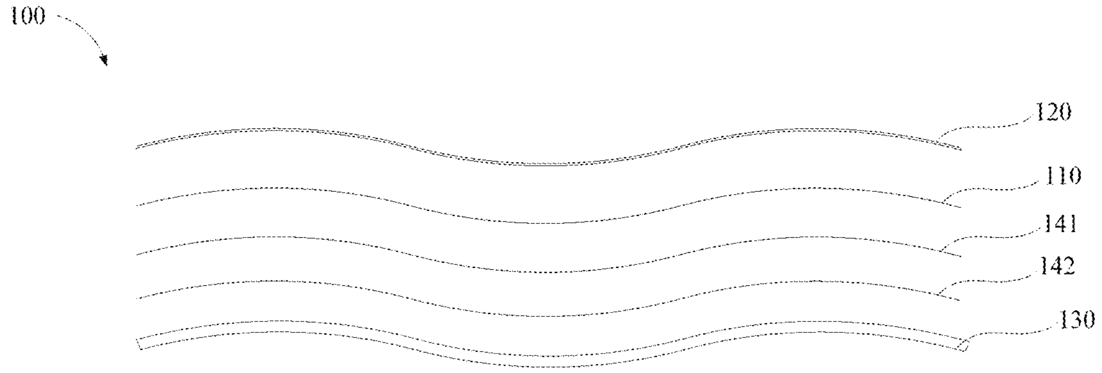
FIG. 2 illustrates a second exploded view of a curved photovoltaic tile according to an embodiment of the present disclosure.

In a possible embodiment, as illustrated in FIG. 1 and FIG. 2, the curved crystalline silicon photovoltaic product (i.e., the curved photovoltaic tile 100) is formed by stacking a composite transparent backsheet (i.e., the first protective layer 120), a power generation unit (i.e., the solar cell 110), a first encapsulation adhesive film (i.e., the first adhesive film layer 141), a second encapsulation adhesive film (i.e., the second adhesive film layer 142), and curved tempered glass (i.e., the second protective layer 130) in sequence, achieving overall encapsulation through a two-step lamination process. The composite transparent backsheet has adhesive and protective functions. Each of the first encapsulation adhesive film and the second encapsulation adhesive film may be made of materials such as EVA, POE, PVB, organic silicone rubber, or the like. The power generation unit may be a crystalline silicon cell or a thin-film cell.

As illustrated in FIG. 3, the composite transparent backsheet is mainly composed of a transparent resin adhesive layer (i.e., the adhesive layer 122) and a transparent PET layer (i.e., the hard protective layer 121). The transparent resin adhesive layer is mainly composed of a resin-based adhesive and has a thickness ranging from 0.2 mm to 0.5 mm. The transparent resin adhesive layer is in a soft state at ambient temperature and cures when heated, providing the adhesive function. The transparent PET layer is mainly made of PET and has a thickness ranging from 0.2 mm to 0.7 mm, providing the protective function.

The power generation unit is the crystalline silicon cell or the thin-film cell. Due to their inherent thinness and rigidity, the crystalline silicon cell and the thin-film cell are prone to micro-cracks when applied in curved photovoltaic products. The transparent resin adhesive layer of the composite transparent backsheet is made of cured resin, which, compared with conventional encapsulation adhesive films, has higher strength after curing. During lamination of the power generation unit with the composite transparent backsheet, the resin of the transparent resin adhesive layer softens under a combined effect of temperature and pressure, allowing the cell to be embedded into the transparent resin adhesive layer. After the transparent resin adhesive layer cures, the cell and the composite transparent backsheet become an integral body, providing better protection for the cell, and enhancing bending resistance of the power generation unit to effectively reduce a probability of micro-cracks during a bending deformation of the power generation unit.

Figure 4:
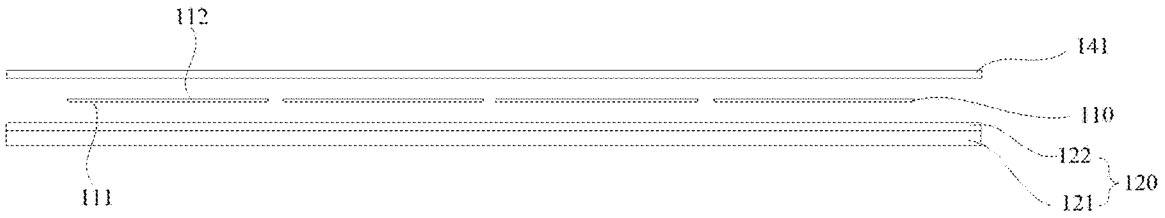
FIG. 4 illustrates a schematic structural view of a first protective layer, a solar cell, and a first adhesive film layer prior to a primary lamination according to an embodiment of the present disclosure.

During the primary lamination, since the transparent resin adhesive layer of the composite transparent backsheet is unable to fully cover a front surface (i.e., the light-receiving side 112) of the power generation unit, a layer of first encapsulation adhesive film is required to be laid on the front surface of the power generation unit to encapsulate and protect the front surface of the power generation unit. A primary lamination process is carried out as follows. The encapsulation adhesive film, the power generation unit, and the composite transparent backsheet are laid out in sequence from bottom to top, and then laminated using the conventional planar laminator. The planar laminator has an upper chamber and a lower chamber, with a pressure difference between the upper chamber and the lower chamber. The lower chamber has a pressure of −100 kPa. A pressure in the upper chamber is illustrated in Table 1. The encapsulation adhesive film, the power generation unit, and the composite transparent backsheet undergo the primary lamination under the pressure difference between the upper chamber and the lower chamber. Parameters for the primary lamination are illustrated in Table 1. The primary lamination includes a first-stage lamination, a second-stage lamination, and a third-stage lamination. A structure and a lamination process of the primary lamination are illustrated in FIG. 4 and FIG. 5.

After the primary lamination is completed, the secondary lamination is performed. To achieve satisfactory filling and adhesive results, a layer of second encapsulation adhesive film is required to be laid on the curved tempered glass during the secondary lamination. A laying sequence is as follows: a primary laminated assembly (i.e., the laminated assembly), the second encapsulation adhesive film, and the curved tempered glass are stacked in a sequence illustrated in FIG. 6. Then, the primary laminated assembly, the second encapsulation adhesive film, and the curved tempered glass are placed into the silicone bag laminator for lamination. Lamination parameters for the silicone bag laminator are illustrated in Table 2. The secondary lamination includes a first-stage lamination, a second-stage lamination, a third-stage lamination, and a fourth-stage lamination. Through this two-step lamination process, the curved crystalline silicon photovoltaic product achieves anti-micro-crack and dual-sided power generation capabilities, improving product yield.

TABLE 1

| Process temperature (° C.) | Vacuum duration (s) | First-stage pressure in upper chamber of planar laminator (kPa) | First-stage lamination duration (s) | Second-stage pressure in upper chamber of planar laminator (kPa) | Second-stage lamination duration (s) | Third-stage pressure in upper chamber of planar laminator (kPa) | Third-stage lamination duration (min) |
|---|---|---|---|---|---|---|---|
| 140 to 150 | 360 to 720 | −80 to −70 | 30 to 60 | −60 to −50 | 30 to 60 | −5 to 0 | 30 to 40 |

TABLE 2

| | |
|---|---|
| Conforming duration (min) | 8 to 10 |
| Vacuum duration (min) | 10 to 12 |
| First-stage lamination temperature (° C.) | 80 to 90 |
| First-stage lamination duration (min) | 5 to 10 |
| Second-stage lamination temperature (° C.) | 100 to 110 |
| Second-stage lamination duration (min) | 5 to 10 |
| Third-stage lamination temperature (° C.) | 120 to 130 |
| Third-stage lamination duration (min) | 5 to 10 |

TABLE 2-continued

| | |
|---|---|
| Fourth-stage lamination temperature (° C.) | 150 to 160 |
| Fourth-stage lamination duration (min) | 40 to 60 |

Full vacuum throughout the process, pressure range: −99 kPa to −100 kPa

Reference throughout this specification to "an embodiment", "some embodiments", "an illustrative embodiment", "an example", "a specific example", or "some examples" means that a particular feature, structure, material, or characteristic described in connection with the embodiment or example is included in at least one embodiment or example of the present disclosure. The appearances of the above phrases in various places throughout this specification are not necessarily referring to the same embodiment or example. Further, the particular features, structures, materials, or characteristics may be combined in any suitable manner in one or more embodiments or examples.

Although embodiments of the present disclosure have been illustrated and described, it is conceivable for those skilled in the art that various changes, modifications, replacements, and variations can be made to these embodiments without departing from the principles and spirit of the present disclosure. The scope of the present disclosure shall be defined by the claims as appended and their equivalents.

What is claimed is:

1. A method for processing a curved photovoltaic tile, the method comprising:

stacking a first adhesive film layer, a solar cell, and a first protective layer on each other in sequence;

performing a primary lamination on the first adhesive film layer, the solar cell, and the first protective layer to form a planar laminated assembly;

stacking a rigid curved second protective layer, a second adhesive film layer, and the laminated assembly on each other in sequence; and performing a secondary lamination on the second protective layer, the second adhesive film layer, and the laminated assembly to form the curved photovoltaic tile, wherein the first protective layer is a two-layer composite structure composed of a hard protective layer and an adhesive layer, and wherein said performing the primary lamination on the first adhesive film layer, the solar cell, and the first protective layer comprises:

pressing the solar cell into the adhesive layer, allowing the solar cell and the adhesive layer to be cured into an integral body; and adhering the first adhesive film layer to the adhesive layer.

2. The method for processing the curved photovoltaic tile according to claim 1, wherein said stacking the rigid curved second protective layer, the second adhesive film layer, and the laminated assembly on each other in sequence comprises:

stacking the second protective layer and the second adhesive film layer on each other; and placing the laminated assembly on the second adhesive film layer with the first adhesive film layer in the laminated assembly facing towards the second adhesive film layer.

3. The method for processing the curved photovoltaic tile according to claim 1, wherein the primary lamination is performed by a first laminator, and wherein said performing the primary lamination on the first adhesive film layer, the solar cell, and the first protective layer comprises:

controlling a heating device of the first laminator to heat an interior of the first laminator to a temperature ranging from 145° C. to 150° C.;

controlling an air-extracting device of the first laminator to vacuumize the interior of the first laminator, wherein an operation duration of the air-extracting device of the first laminator ranges from 360 s to 720 s;

controlling the first laminator to laminate the first adhesive film layer, the solar cell, and the first protective layer at a first pressure for a first duration, wherein the first pressure ranges from 20 kPa to 30 kPa, and the first duration ranges from 30 s to 60 s;

controlling the first laminator to laminate the first adhesive film layer, the solar cell, and the first protective layer at a second pressure for a second duration, wherein the second pressure ranges from 40 kPa to 50 kPa, and wherein the second duration ranges from 30 s to 60 s; and controlling the first laminator to laminate the first adhesive film layer, the solar cell, and the first protective layer at a third pressure for a third duration, wherein the third pressure ranges from 95 kPa to 100 kPa, and wherein the third duration ranges from 30 min to 40 min.

4. The method for processing the curved photovoltaic tile according to claim 1, wherein the secondary lamination is performed by a second laminator, and wherein said performing the secondary lamination on the second protective layer, the second adhesive film layer, and the laminated assembly comprises:

controlling an air-extracting device of the second laminator to vacuumize an interior of the second laminator, wherein an operation duration of the air-extracting device of the second laminator ranges from 10 min to 12 min;

controlling a heating device of the second laminator to heat the interior of the second laminator to a temperature ranging from 80° C. to 90° C.;

controlling the second laminator to laminate the second protective layer, the second adhesive film layer, and the laminated assembly at a fourth pressure for a fourth duration, wherein the fourth pressure ranges from 99 kPa to 100 kPa, and wherein the fourth duration ranges from 5 min to 10 min;

controlling the heating device of the second laminator to heat the interior of the second laminator to a temperature ranging from 100° C. to 110° C.;

controlling the second laminator to laminate the second protective layer, the second adhesive film layer, and the laminated assembly at the fourth pressure for the fourth duration;

controlling the heating device of the second laminator to heat the interior of the second laminator to a temperature ranging from 120° C. to 130° C.;

controlling the second laminator to laminate the second protective layer, the second adhesive film layer, and the laminated assembly at the fourth pressure for the fourth duration;

controlling the heating device of the second laminator to heat the interior of the second laminator to a temperature ranging from 150° C. to 160° C.; and controlling the second laminator to laminate the second protective layer, the second adhesive film layer, and the laminated assembly at the fourth pressure for a fifth duration, wherein the fifth duration ranges from 40 min to 60 min.

5. The method for processing the curved photovoltaic tile according to claim 1, wherein the adhesive layer is in a soft state at ambient temperature, and wherein said pressing the solar cell into the adhesive layer, allowing the solar cell and the adhesive layer to be cured into an integral body comprises:

pressing the solar cell into the adhesive layer at ambient temperature; and heating the adhesive layer to cure the adhesive layer, allowing the solar cell and the adhesive layer to be cured into the integral body.

6. The method for processing the curved photovoltaic tile according to claim 1, wherein the adhesive layer has a thickness ranging from 0.2 mm to 0.5 mm.

7. The method for processing the curved photovoltaic tile according to claim 1, wherein said stacking the first adhesive film layer, the solar cell, and the first protective layer on each other in sequence comprises:

stacking the first adhesive film layer, the solar cell, and the first protective layer in sequence from bottom to top, wherein the adhesive layer of the first protective layer faces toward the solar cell.

8. A curved photovoltaic tile, comprising:

a solar cell configured to convert light energy into electrical energy, the solar cell having a backlit side and a light-receiving side that face away from each other;

a first protective layer partially located on the backlit side of the solar cell;

a first adhesive film layer located on the light-receiving side of the solar cell;

a second protective layer located on a side of the first adhesive film layer facing away from the solar cell; and a second adhesive film layer located between the second protective layer and the first adhesive film layer, wherein the first protective layer is a two-layer composite structure composed of a hard protective layer and an adhesive layer, the adhesive layer being located on a side of the hard protective layer facing towards the first adhesive film layer, the solar cell being embedded in the adhesive layer, and the first adhesive film layer being adhered to the adhesive layer.

9. The curved photovoltaic tile according to claim 8, wherein the adhesive layer is made of resin.

10. The curved photovoltaic tile according to claim 8, wherein each of the solar cell, the first protective layer, and the second protective layer has a curved surface.

11. The curved photovoltaic tile according to claim 8, wherein each of the first adhesive film layer and the second adhesive film layer is optically transmissive.

12. The curved photovoltaic tile according to claim 8, wherein the adhesive layer has a thickness ranging from 0.2 mm to 0.5 mm.

13. The curved photovoltaic tile according to claim 8, wherein the hard protective layer is made of polyethylene terephthalate.

14. The curved photovoltaic tile according to claim 8, wherein the hard protective layer has a thickness ranging from 0.2 mm to 0.7 mm.

15. The curved photovoltaic tile according to claim 8, wherein the solar cell comprises a crystalline silicon cell or a thin-film cell.

16. The curved photovoltaic tile according to claim 8, wherein each of the first protective layer and the second protective layer is optically transmissive.

17. The curved photovoltaic tile according to claim 8, wherein the curved photovoltaic tile is a dual-sided power-generating photovoltaic tile.

18. A photovoltaic device, comprising a curved photovoltaic tile, wherein the curved photovoltaic tile comprises:

a solar cell configured to convert light energy into electrical energy, the solar cell having a backlit side and a light-receiving side that face away from each other;

a first protective layer partially located on the backlit side of the solar cell;

a first adhesive film layer located on the light-receiving side of the solar cell;

a second protective layer located on a side of the first adhesive film layer facing away from the solar cell; and a second adhesive film layer located between the second protective layer and the first adhesive film layer, wherein the first protective layer is a two-layer composite structure composed of a hard protective layer and an adhesive layer, the adhesive layer being located on a side of the hard protective layer facing towards the first adhesive film layer, the solar cell being embedded in the adhesive layer, and the first adhesive film layer being adhered to the adhesive layer.

* * * * *